US008530900B2

(12) United States Patent
Matsumoto et al.

(10) Patent No.: US 8,530,900 B2
(45) Date of Patent: Sep. 10, 2013

(54) METHOD FOR SELECTIVELY FORMING CRYSTALLINE SILICON LAYER REGIONS ABOVE GATE ELECTRODES

(75) Inventors: Mitsutaka Matsumoto, Kyoto (JP); Yuta Sugawara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/495,387

(22) Filed: Jun. 13, 2012

(65) Prior Publication Data
US 2013/0134431 A1    May 30, 2013

Related U.S. Application Data

(63) Continuation of application No. PCT/JP2011/006642, filed on Nov. 29, 2011.

(51) Int. Cl.
*H01L 21/8234* (2006.01)
*H01L 27/088* (2006.01)

(52) U.S. Cl.
USPC ............................................. 257/72; 438/158

(58) Field of Classification Search
CPC .................... H01L 21/8234; H01L 27/088
USPC ............... 438/157, 158, 166; 257/57, 66, 257/72, E21.409, E21.411, E21.414, E29.273
See application file for complete search history.

(56) References Cited

U.S. PATENT DOCUMENTS

| | | | |
|---|---|---|---|
| 6,746,901 B2 | 6/2004 | Kasahara et al. | |
| 7,064,016 B2 | 6/2006 | Kasahara et al. | |
| 7,160,784 B2 | 1/2007 | Yamazaki et al. | |
| 7,510,915 B2 | 3/2009 | Kasahara et al. | |
| 7,618,904 B2 | 11/2009 | Yamazaki et al. | |
| 2002/0017685 A1 | 2/2002 | Kasahara et al. | |
| 2002/0119633 A1 | 8/2002 | Yamazaki et al. | |
| 2004/0063258 A1 | 4/2004 | Kasahara et al. | |
| 2006/0246634 A1 | 11/2006 | Kasahara et al. | |
| 2006/0276012 A1 | 12/2006 | Yamazaki et al. | |
| 2010/0301339 A1* | 12/2010 | Morimura et al. ............... 257/57 |

FOREIGN PATENT DOCUMENTS

| | | |
|---|---|---|
| JP | 2002-33330 | 1/2002 |
| JP | 2002-261008 | 9/2002 |
| JP | 2003-347207 | 12/2003 |
| JP | 2010-192611 | 9/2010 |
| JP | 2011-66243 | 3/2011 |

OTHER PUBLICATIONS

Sugawara, Y.; Uraoka, Y.; Yano, H.; Hatayama, T.; Fuyuki, T.; Mimura, A.; , "Crystallization of Double-Layered Silicon Thin Films by Solid Green Laser Annealing for High-Performance Thin-Film Transistors," Electron Device Letters, IEEE , vol. 28, No. 5, pp. 395-397, May 2007.*

* cited by examiner

*Primary Examiner* — Walter H Swanson
(74) *Attorney, Agent, or Firm* — Greenblum & Bernstein, P.L.C.

(57) ABSTRACT

Preparing a substrate; forming a plurality of gate electrodes above the substrate; forming a gate insulating layer above the gate electrodes; forming an amorphous silicon layer above the gate insulating layer; forming crystalline silicon layer regions by irradiating the amorphous silicon layer in regions above the gate electrodes with a laser beam having a wavelength from 473 nm to 561 nm so as to crystallize the amorphous silicon layer in the regions above the gate electrodes, and forming an amorphous silicon layer region in a region other than the regions above the gate electrodes; and forming source electrodes and drain electrodes above the crystalline silicon layer regions are included, and a thickness of the gate insulating layer and a thickness of the amorphous silicon layer satisfy predetermined expressions.

10 Claims, 13 Drawing Sheets

METHOD FOR SELECTIVELY FORMING CRYSTALLINE SILICON LAYER REGIONS ABOVE GATE ELECTRODES

CROSS REFERENCE TO RELATED APPLICATION

This is a continuation application of PCT Patent Application No. PCT/JP2011/006642 filed on Nov. 29, 2011, designating the United States of America. The entire disclosure of the above-identified application, including the specification, drawings and claims are incorporated herein by reference in its entirety.

TECHNICAL FIELD

The present disclosure relates to a thin-film transistor array manufacturing method, a thin-film transistor array, and a display device.

BACKGROUND ART

In recent years, an organic EL display using organic electroluminescence (EL) has been attracting attention as one of the next-generation flat-panel displays replacing the liquid crystal displays. A thin-film transistor array in which thin-film transistor (TFT) elements are arranged in a matrix is used for an active-matrix display device such as the organic EL display.

A bottom-gate thin film transistor array in which the gate electrodes are formed on a side toward the substrate with respect to the silicon layer is generally used for the thin-film transistor array. FIG. 10 is a perspective view schematically illustrating the laser annealing in a conventional thin-film transistor array manufacturing method. A conventional thin-film transistor array 500 is manufactured as follows (for example, see the patent literatures 1 and 2).

First, a substrate 51 is prepared (first process), and an undercoat layer 52 is formed on the substrate 51. Next, gate electrodes 53a and 53b are formed on the undercoat layer 52 (second process). Subsequently, a gate insulating layer 56 is formed on the gate electrodes 53a and 53b (third process). The gate insulating layer 56 is formed by stacking a silicon nitride film 54 and a silicon oxide film 55. For example, the thickness of the silicon nitride film 54 is approximately 65 nm, and the thickness of the silicon oxide film 55 is approximately 85 nm. Subsequently, an amorphous silicon layer 57 made of amorphous silicon is formed on the gate insulating layer 56 (fourth process). For example, the thickness of the amorphous silicon layer 57 is approximately 45 nm. After that, a crystalline silicon layer 58 made of polysilicon (polycrystalline silicon) is formed by the laser annealing (fifth process). With the laser annealing method, as illustrated in FIG. 10, a laser light source (not illustrated) is moved in a predetermined direction relative to the substrate 51 such that the amorphous silicon layer 57 is entirely irradiated with the laser beam. With this, the amorphous silicon layer 57 is entirely crystallized with the heat generated by the laser beam, thereby forming the crystalline silicon layer 58. Subsequently, in regions above the crystalline silicon layer 58 corresponding to the gate electrodes 53a and 53b, source electrodes (not illustrated) and drain electrodes (not illustrated) are formed (sixth process).

CITATION LIST

Patent Literature

[Patent Literature 1] Japanese Unexamined Patent Application Publication No. 2002-261008

[Patent Literature 2] Japanese Unexamined Patent Application Publication No. 2010-192611

SUMMARY OF INVENTION

Technical Problem

The conventional thin-film transistor array manufacturing method described above has the following problem. FIG. 11 is a plan view illustrating a state in which the amorphous silicon layer is irradiated with the laser beam in the conventional thin-film transistor array manufacturing method. The part with oblique lines in FIG. 11 indicates a region in which the crystalline silicon layer is formed by crystallizing the amorphous silicon layer. In FIG. 11, a region 61 is regions above the gate electrodes, and a region 62 is a region other than the regions above the gate electrodes. As illustrated in FIG. 11, in the fifth process, the regions 61 and the region 62, that is, the entire amorphous silicon layer is crystallized so as to form the crystalline silicon layer.

However, in the fifth process, when the entire amorphous silicon layer is crystallized, the heat due to the laser beam is transmitted to the entire substrate through the gate insulating layer. With this, there is a possibility that a crack or warpage occur in the substrate due to a large thermal load exerted on the substrate. In addition, when crystallizing the entire amorphous silicon layer, a large stress is exerted on the crystalline silicon layer. There is a possibility of crack or warpage in the substrate as well, due to the stress transmitted to the substrate.

One non-limiting and exemplary embodiment has been conceived in view of the problem, and provides a thin-film transistor array manufacturing method, a thin-film transistor array, and a display device capable of suppressing a crack or warpage in the substrate. Additional benefits and advantages of the disclosed embodiments will be apparent from the specification and Figures. The benefits and/or advantages may be individually provided by various embodiments and features of the specification and drawings disclosure, and need not all be provided in order to obtain one or more of the same.

Solution to Problem

In one general aspect, the techniques disclosed here feature an aspect of a thin-film transistor array device manufacturing method including: preparing a substrate; forming a plurality of gate electrodes above the substrate; forming a gate insulating layer above the gate electrodes; forming an amorphous silicon layer above the gate insulating layer; forming crystalline silicon layer regions by irradiating the amorphous silicon layer in regions above the gate electrodes with a laser beam while relatively moving, in a predetermined direction with respect to the substrate, a laser light source which emits the laser beam having a wavelength from 473 nm to 561 nm so as to crystallize the amorphous silicon layer in the regions above the gate electrodes; and forming source electrodes and drain electrodes above the crystalline silicon layer regions, wherein given that X represents a value obtained by dividing an optical film thickness of the amorphous silicon layer by a wavelength of the laser beam, the optical film thickness of the amorphous silicon layer being a value obtained by multiplying a thickness of the amorphous silicon layer formed in the amorphous silicon layer forming and a refractive index of the amorphous silicon layer, and Y represents a value obtained by dividing an optical film thickness of the gate insulating layer by the wavelength of the laser beam, the optical film thickness of the gate insulating layer being a value obtained by multiplying a thickness of the gate insulating layer formed in the gate insulating layer forming and a refractive index of the gate insulating layer, X and Y are values satisfying a range determined by Expressions 1 to 5, and given that x represents absorptance (%) of the laser beam by the amorphous silicon layer formed in the amorphous silicon layer forming, and y represents a relative value with respect to an energy density of the laser beam, which is defined as 1, necessary for crystallizing the amorphous silicon layer so as to form the crystalline silicon layer regions when the absorptance, for the laser beam, of the amorphous silicon layer formed in the amorphous silicon layer forming is 23.2(%), and x and y are value satisfying a range determined by Expressions 6, 7, and 8, Expression 1: $Y \geq -4400X^6+12600X^5-14900X^4+9320X^3-3250X^2+594X-43.7$, Expression 2: $Y \leq 0.69$, Expression 3: $Y \geq 0.33$, Expression 4: $X \leq 0.85$, Expression 5: $Y \leq -119000X^6+529000X^5-980000X^4+965000X^3-533000X^2+157000X-19100$, Expression 6: $20 \leq x \leq 50$, Expression 7: $y \geq 42.9x^{-1.19}$, Expression 8: $y \leq -0.0041x+1.45$.

Advantageous Effects of Invention

According to the thin-film transistor array of the present disclosure, the amorphous silicon layer is locally crystallized. Accordingly, the heat due to the laser beam is locally transmitted to the substrate through the gate insulating layer. With this, it is possible to suppress the thermal load on the substrate to a small value, suppressing the crack or warpage on the substrate. Furthermore, it is possible to suppress the stress that occurs when crystallizing the amorphous silicon layer. Accordingly, it is possible to suppress the crack or warpage generated on the substrate.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings.

DETAILED DESCRIPTION

Figure 1:
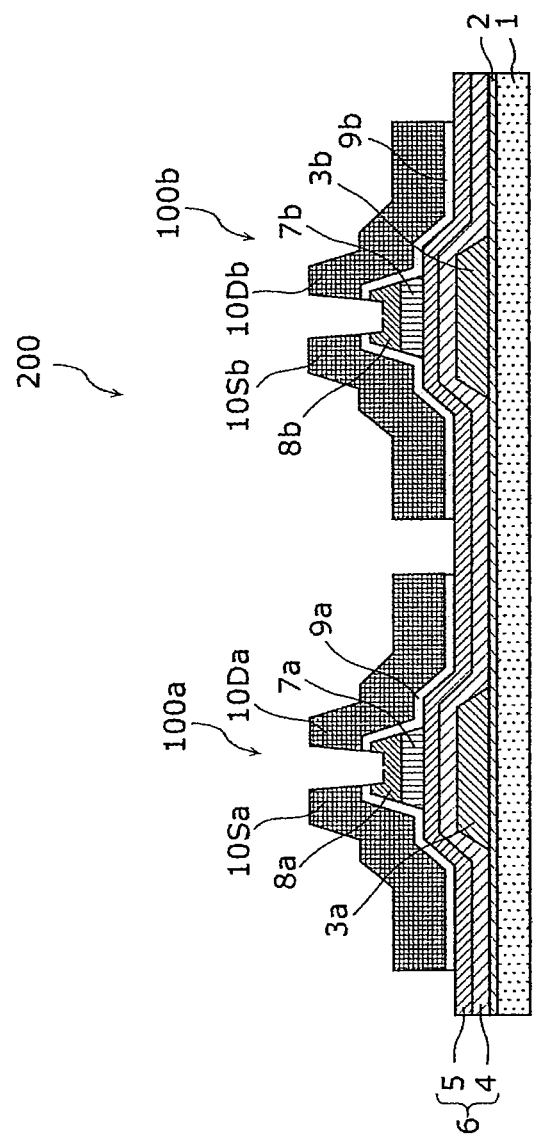
FIG. 1 is a cross-sectional view illustrating a configuration of a thin-film transistor array according to an embodiment of the present disclosure.

The thin-film transistor array manufacturing method according to an aspect of the present disclosure includes: preparing a substrate; forming a plurality of gate electrodes above the substrate; forming a gate insulating layer above the gate electrodes; forming an amorphous silicon layer above the gate insulating layer; forming crystalline silicon layer regions by irradiating the amorphous silicon layer in regions above the gate electrodes with a laser beam while relatively moving, in a predetermined direction with respect to the substrate, a laser light source which emits the laser beam having a wavelength from 473 nm to 561 nm so as to crystallize the amorphous silicon layer in the regions above the gate electrodes; and forming source electrodes and drain electrodes above the crystalline silicon layer regions, wherein given that X represents a value obtained by dividing an optical film thickness of the amorphous silicon layer by a wavelength of the laser beam, the optical film thickness of the amorphous silicon layer being a value obtained by multiplying a thickness of the amorphous silicon layer formed in the amorphous silicon layer forming and a refractive index of the amorphous silicon layer, and Y represents a value obtained by dividing an optical film thickness of the gate insulating layer by the wavelength of the laser beam, the optical film thickness of the gate insulating layer being a value obtained by multiplying a thickness of the gate insulating layer formed in the gate insulating layer forming and a refractive index of the gate insulating layer, X and Y are values satisfying a range determined by Expressions 1 to 5, Expression 1: $Y \geq -4400X^6+12600X^5-14900X^4+9320X^3-3250X^2+594X-43.7$, Expression 2: $Y \leq 0.69$, Expression 3: $Y \geq 0.33$, Expression 4: $X \leq 0.85$, Expression 5: $Y \leq -119000X^6+529000X^5-980000X^4+965000X^3-533000X^2+157000X-19100$.

According to this aspect, the amorphous silicon layer is locally crystallized. Thus, the heat due to the laser beam is locally transmitted to the substrate through the gate insulating layer. With this, it is possible to suppress the thermal load on the substrate to a small value, suppressing the crack or warpage in the substrate. Furthermore, it is possible to suppress the stress that occurs when crystallizing the amorphous silicon layer. Accordingly, it is possible to suppress the crack or warpage generated in the substrate.

Furthermore, in the thin-film transistor array manufacturing method according to an aspect of the present disclosure, given that x represents absorptance (%) of the laser beam by the amorphous silicon layer formed in the amorphous silicon layer forming, and y represents a relative value with respect to an energy density of the laser beam, which is defined as 1, necessary for crystallizing the amorphous silicon layer so as to form the crystalline silicon layer regions when the absorptance, for the laser beam, of the amorphous silicon layer formed in the amorphous silicon layer forming is 23.2(%), and x and y are value satisfying a range determined by Expressions 6, 7, and 8, Expression 6: $20 \leq x \leq 50$, Expression 7: $y \geq 42.9x^{-1.19}$, Expression 8: $y \leq -0.0041x+1.45$.

According to this aspect, the crystalline silicon layer region can be formed stably by the laser irradiation.

Furthermore, in the thin-film transistor array manufacturing method according to an aspect of the present disclosure, in the crystalline silicon layer regions forming, an amorphous silicon layer region is formed in a region other than the regions above the gate electrodes, and the amorphous silicon layer region includes microcrystalline silicon, for example.

According to this aspect, since the amorphous silicon layer region includes microcrystalline silicon, the stress exerted on the substrate is reduced by the amorphous silicon layer region.

Furthermore, in the thin-film transistor array manufacturing method according to an aspect of the present disclosure, the amorphous silicon layer region further includes amorphous silicon, for example.

According to this aspect, since the amorphous silicon layer region further includes the amorphous silicon, the amorphous silicon layer region reduces the stress exerted on the substrate more effectively.

Furthermore, in the thin-film transistor array manufacturing method according to an aspect of the present disclosure, in the crystalline silicon layer regions forming, an amorphous silicon layer region is formed in a region other than the regions above the gate electrodes, and the amorphous silicon layer region includes amorphous silicon, for example.

According to this aspect, since the amorphous silicon layer region includes the amorphous silicon, the amorphous silicon layer region reduces the stress exerted on the substrate effectively.

Furthermore, in the thin-film transistor array manufacturing method according to an aspect of the present disclosure, in the crystalline silicon layer regions forming, the laser light source emits the laser beam in a continuous wave mode or a quasi-continuous wave mode, for example.

According to this aspect, the amorphous silicon layer can be maintained in the melting state by irradiating the amorphous silicon layer with the laser beam in the continuous wave mode or the quasi-continuous wave mode.

Furthermore, in the thin-film transistor array manufacturing method according to an aspect of the present disclosure, an extinction coefficient of the gate insulating layer formed in the gate insulating layer forming relative to the wavelength of the laser beam is less than or equal to 0.01, for example.

According to this aspect, by having the extinction coefficient of the gate insulating layer with respect to the wavelength of the laser beam less than or equal to 0.01, the laser beam is barely absorbed by the gate insulating layer. Accordingly, it is possible to suppress the heat due to the laser beam from generating in the gate insulating layer. With this, it is possible to suppress the heat due to the laser beam from transmitted to the substrate in the region other than the regions above the gate electrodes.

Furthermore, in the thin-film transistor array manufacturing method according to an aspect of the present disclosure, the gate insulating layer formed in the gate insulating layer forming is a silicon oxide film, for example.

According to this aspect, the gate insulating layer is formed of the silicon oxide film.

Furthermore, in the thin-film transistor array manufacturing method according to an aspect of the present disclosure, the gate insulating layer formed in the gate insulating layer forming is a silicon nitride film, for example.

According to this aspect, the gate insulating layer is formed of the silicon nitride film.

The thin-film transistor array according to an aspect of the present disclosure includes: a substrate: a plurality of gate electrodes formed above the substrate; a gate insulating layer formed above the gate electrodes; a crystalline silicon layer formed above the gate insulating layer in regions corresponding to the gate electrodes; and source electrodes and drain electrodes formed above the crystalline silicon layer in regions corresponding to the gate electrodes, wherein, after forming an amorphous silicon layer on the gate insulating layer, the crystalline silicon layer is formed by irradiating the amorphous silicon layer in regions above the gate electrodes with a laser beam while relatively moving, in a predetermined direction with respect to the substrate, a laser light source which emits the laser beam having a wavelength from 473 nm to 561 nm so as to crystallize the amorphous silicon layer in the regions above the gate electrodes, given that X represents a value obtained by dividing an optical film thickness of the amorphous silicon layer by a wavelength of the laser beam, the optical film thickness of the amorphous silicon layer being a value obtained by multiplying a thickness of the amorphous silicon layer formed in the amorphous silicon layer forming and a refractive index of the amorphous silicon layer, and Y represents a value obtained by dividing an optical film thickness of the gate insulating layer by the wavelength of the laser beam, the optical film thickness of the gate insulating layer being a value obtained by multiplying a thickness of the gate insulating layer formed in the gate insulating layer forming and a refractive index of the gate insulating layer, X and Y are values satisfying a range determined by Expressions 1 to 5, Expression 1: $Y \geq -4400X^6+12600X^5-14900X^4+9320X^3-3250X^2+594X-43.7$, Expression 2: $Y \leq 0.69$, Expression 3: $Y \geq 0.33$, Expression 4: $X \leq 0.85$, Expression 5: $Y \leq -119000X^6+529000X^5-980000X^4+965000X^3-533000X^2+157000X-19100$.

According to this aspect, the amorphous silicon layer is locally crystallized. Thus, the heat due to the laser beam is locally transmitted to the substrate through the gate insulating layer. With this, it is possible to suppress the thermal load on the substrate to a small value, suppressing the crack or warpage on the substrate. Furthermore, it is possible to suppress the stress that occurs when crystallizing the amorphous silicon layer. Accordingly, it is possible to suppress the crack or warpage generated in the substrate.

The display device according to an aspect of the present disclosure includes a display panel; and the thin-film transistor array according to claim 9, and the thin-film transistor array drives the display panel.

According to this aspect, it is possible to suppress the crack or warpage generated on the substrate, implementing a high-quality display device.

Embodiment

The following shall describe a thin-film transistor array manufacturing method, a thin-film transistor array, and a display device according to an aspect of the present disclosure with reference to the drawings. Note that, the following embodiment describes a specific example of the present disclosure. Numbers, shapes, material, components positional arrangements and connections of the components, steps, order of the steps described in the following embodiments are merely examples, and do not intend to limit the present disclosure. Furthermore, among the components in the embodiment, the components not recited in the independent claim which describes the most generic concept shall be described as optional components. Note that, the diagrams are schematic views, and the illustration is not always strictly accurate.

FIG. 1 is a cross-sectional view illustrating a configuration of the thin-film transistor array according to the embodiment of the present disclosure. As illustrated in FIG. 1, a thin-film transistor array 200 according to the embodiment includes thin-film transistor elements 100a and 100b arranged in a matrix. Note that, for facilitating understanding, only two thin-film transistor elements 100a and 100b are illustrated in FIG. 1.

The thin-film transistor elements 100a and 100b are bottom-gate thin-film transistor elements. Since the configuration of the thin-film transistor elements 100a and 100b is identical, the following shall describe the configuration of the thin-film transistor element 100a. The thin-film transistor element 100a includes a substrate 1, an undercoat layer 2, a gate electrode 3a, a gate insulating layer 6, a crystalline silicon layer 7a, an amorphous silicon layer 8a, a contact layer 9a, a source electrode 10Sa and a drain electrode 10Da.

The substrate 1 is a glass substrate made of, for example, a glass material such as silica glass, alkali-free glass, or highly heat-resistant glass.

The undercoat layer 2 is formed on the substrate 1. The undercoat layer 2 is made of, for example, a silicon nitride film ($SiN_x$), a silicon oxide film ($SiO_y$), a silicon oxynitride film ($SiO_yN_x$) or others. The undercoat layer 2 is formed to prevent an impurity included in the substrate 1 from entering the crystalline silicon layer 7a. The undercoat layer 2 also functions to reduce the effect of heat on the substrate 1 in a high-temperature thermal treatment process such as laser annealing.

The gate electrode 3a is patterned in a predetermined shape on the undercoat layer 2. The gate electrode 3a may be made of a single-layer structure or a multi-layer structure of conductive materials and alloys of the conductive materials such as molybdenum (Mo), aluminum (Al), copper (Cu), tungsten (W), titanium (Ti), chromium (Cr), molybdenum-tungsten (MoW), and others.

The gate insulating layer 6 is formed on the undercoat layer 2 so as to cover the gate electrode 3a. In the embodiment, the gate insulating layer 6 is made of a stacked film of a silicon nitride film 4 made of silicon nitride ($Si_3Ni_4$) and a silicon oxide film 5 made of silicon oxide ($SiO_2$).

The crystalline silicon layer 7a is formed in a region on the gate insulating layer 6 corresponding to the gate electrode 3a. The crystalline silicon layer 7a is made of polysilicon. Note that, to be described later, the crystalline silicon layer 7a is formed by irradiating the amorphous silicon layer 12 with the laser beam so as to crystallize the amorphous silicon layer 12.

The amorphous silicon layer 8a is formed on the crystalline silicon layer 7a. The amorphous silicon layer 8a is made of amorphous silicon. The thin-film transistor element 100a according to the embodiment includes a two-layered channel layer composed of the crystalline silicon layer 7a and the amorphous silicon layer 8a stacked. The channel layer is a layer for controlling the movement of carriers according to a voltage at the gate electrode 3a.

The contact layer 9a is formed to cover the sides of the crystalline silicon layer 7a and the side surfaces of the amorphous silicon layer 8a and an upper surface of the gate insulating layer 6. The contact layer 9a is made of an amorphous semiconductor film including impurity concentration at a high level. The contact layer 9a may be formed of an n-type semiconductor film which is an amorphous silicon doped with phosphorus (P) as an impurity, and is an n+ layer including the impurity at a high level greater than or equal to $1 \times 10^{19}$ atm/$cm^3$.

The source electrode 10Sa and the drain electrode 10Da are formed on the contact layer 9a. The source electrode 10Sa and the drain electrode 10Da are provided with an interval and opposite to each other. The source electrode 10Sa and the drain electrode 10Da may be a single-layer structure or multi-layer structure of conductive materials, and alloys of the conductive materials such as aluminum (Al), molybdenum (Mo), tungsten (W), copper (Cu), titanium (Ti), chromium (Cr), and others.

In the same manner as the thin-film transistor element 100a, the thin-film transistor element 100b includes the substrate 1, the undercoat layer 2, the gate electrode 3b, the gate insulating layer 6, the crystalline silicon layer 7b, the amorphous silicon layer 8b, the contact layer 9b, the source electrode 10Sb and the drain electrode 10Db.

Next, the method of manufacturing the thin-film transistor array 200 shall be described with reference to FIGS. 2A to 2L. FIGS. 2A to 2L are cross-sectional views for describing the method of manufacturing thin-film transistor array 200 according to the embodiment of the present disclosure.

Figure 2A:
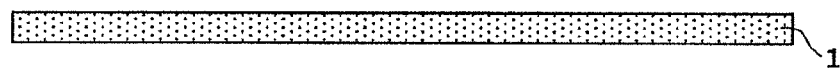
FIG. 2A is a cross-sectional view for describing a thin-film transistor array manufacturing method according to the embodiment of the present disclosure.
Figure 2B:
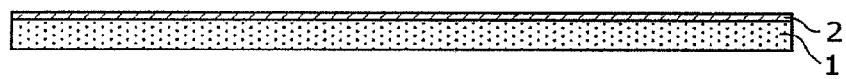
FIG. 2B is a cross-sectional view for describing the thin-film transistor array manufacturing method according to the embodiment of the present disclosure.

First, as illustrated in FIG. 2A, the substrate 1 made of a glass substrate is prepared (first process). Next, as illustrated in FIG. 2B, the undercoat layer 2 made of a silicon nitride film, a silicon oxide film, or a silicon oxynitride film is formed by the plasma chemical vapor deposition (CVD) or others.

Figure 2C:
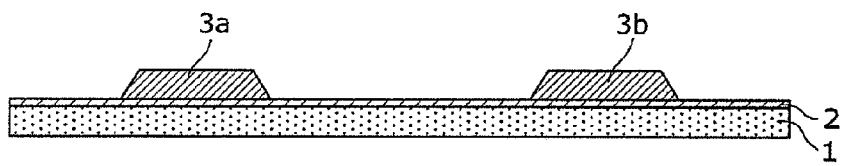
FIG. 2C is a cross-sectional view for describing the thin-film transistor array manufacturing method according to the embodiment of the present disclosure.

Subsequently, as illustrated in FIG. 2C, the gate electrodes 3a and 3b are formed on the undercoat layer 2, as illustrated in FIG. 2C (second process). In the second process, the gate electrodes 3a and 3b in the predetermined shape are formed by forming a gate metal film made of molybdenum-tungsten (MoW) on the undercoat layer 2 through sputtering, and by patterning the gate metal film using the photolithography and the wet etching. The wet etching on molybdenum-tungsten (MoW) may be performed using a chemical solution which is a mixture of hydrogen phosphate ($HPO_4$), nitric acid ($HNO_3$), acetic acid ($CH_3COOH$) and water in a predetermined ratio.

Figure 2D:
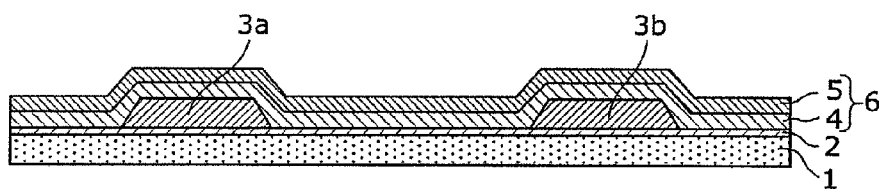
FIG. 2D is a cross-sectional view for describing the thin-film transistor array manufacturing method according to the embodiment of the present disclosure.

Subsequently, as illustrated in FIG. 2D, the gate insulating layer 6 is formed to cover the gate electrodes 3a, 3b and the undercoat layer 2 (third process). In the third process, first, the silicon nitride film 4 made of silicon nitride ($Si_3N_4$) is formed to cover the gate electrodes 3a and 3b and the undercoat layer 2 by the plasma CVD or others. Subsequently, the silicon oxide film 5 made of silicon oxide ($SiO_2$) is formed on the silicon nitride film 4 by the plasma CVD or others. The silicon oxide film 5 is formed by introducing silane gas ($SiH_4$) and nitrous oxide ($N_2O$) in a predetermined ratio of concentration, for example. Note that, in the embodiment, the thickness of the silicon nitride film 4 is approximately 80 nm, and the thickness of the silicon oxide film 5 is approximately 75 nm. Note that, the extinction coefficient of the gate insulating layer 6 with respect to the wavelength of the laser beam is preferably 0.01 or less. Accordingly, the gate insulating layer 6 is a transparent layer which barely absorbs the laser beam.

Figure 2E:
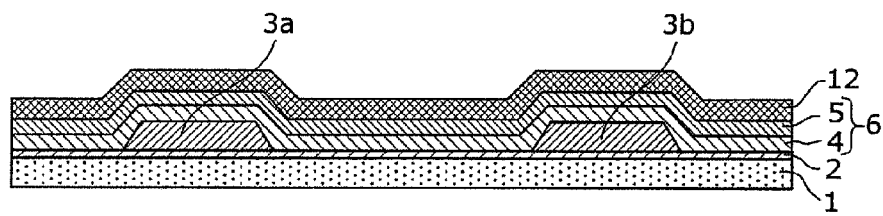
FIG. 2E is a cross-sectional view for describing the thin-film transistor array manufacturing method according to the embodiment of the present disclosure.

Subsequently, as illustrated in FIG. 2E, the amorphous silicon layer 12 is formed on the gate insulating layer 6 (fourth process). In this fourth process, the amorphous silicon layer 12 made of an amorphous silicon is formed by the plasma CVD or others. Note that, the amorphous silicon layer 12 is formed by introducing the silane gas ($SiH_4$) and hydrogen gas ($H_2$) in a predetermined ratio of concentration, for example. Note that, in the embodiment, the thickness of the amorphous silicon layer 12 is approximately 65 nm.

Figure 2F:
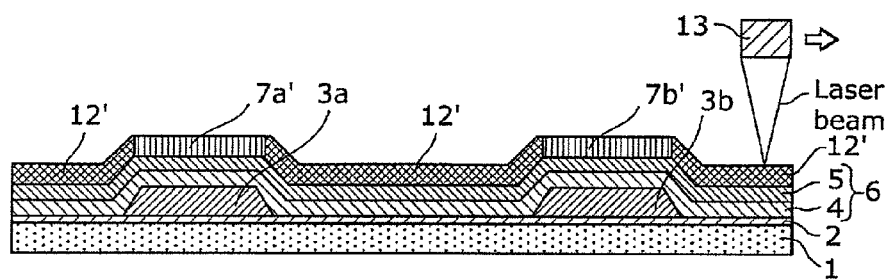
FIG. 2F is a cross-sectional view for describing the thin-film transistor array manufacturing method according to the embodiment of the present disclosure.

Subsequently, as illustrated in FIG. 2F, the amorphous silicon layer 12 in regions above the gate electrodes 3a and 3b are crystallized by laser annealing so as to form the crystalline silicon layer regions 7a' and 7b' (fifth process). In the fifth process, after performing a dehydrogenation treatment on the amorphous silicon layer 12 formed in the fourth process, the amorphous silicon layer 12 is entirely irradiated with the laser beam from the laser light source 13 by the laser annealing. In the laser annealing, the laser light source 13 moves in a predetermined direction relative to the substrate 1 with the position of a stage (not illustrated) on which the substrate 1 is mounted fixed. Accordingly, scanning is performed while irradiating the amorphous silicon layer 12 entirely with the laser beam linearly collected. Alternatively, with the position of the laser light source 13 fixed, the stage on which the substrate 1 is mounted may move in the predetermined direction relative to the laser light source 13. In this embodiment, the laser beam used in the laser annealing is a green laser beam having a wavelength from 473 nm to 561 nm.

Note that, during the irradiation, the laser beam is emitted in the continuous wave mode or the quasi-continuous wave mode, for example. This is because; irradiation using the laser beam in the continuous wave mode or the quasi-continuous wave mode maintains the amorphous silicon layer 12 in the melting state. Note that, when the laser beam is used for irradiation in a mode other than the modes described above, for example, in a pulsed mode, the amorphous silicon layer 12 is discontinuously irradiated with the laser beam. Accordingly, it is difficult to maintain the amorphous silicon layer 12 in the melting state. Note that, the laser light source 13 may be configured of a solid-state laser device, or a laser device using a semiconductor laser element.

Figure 3:
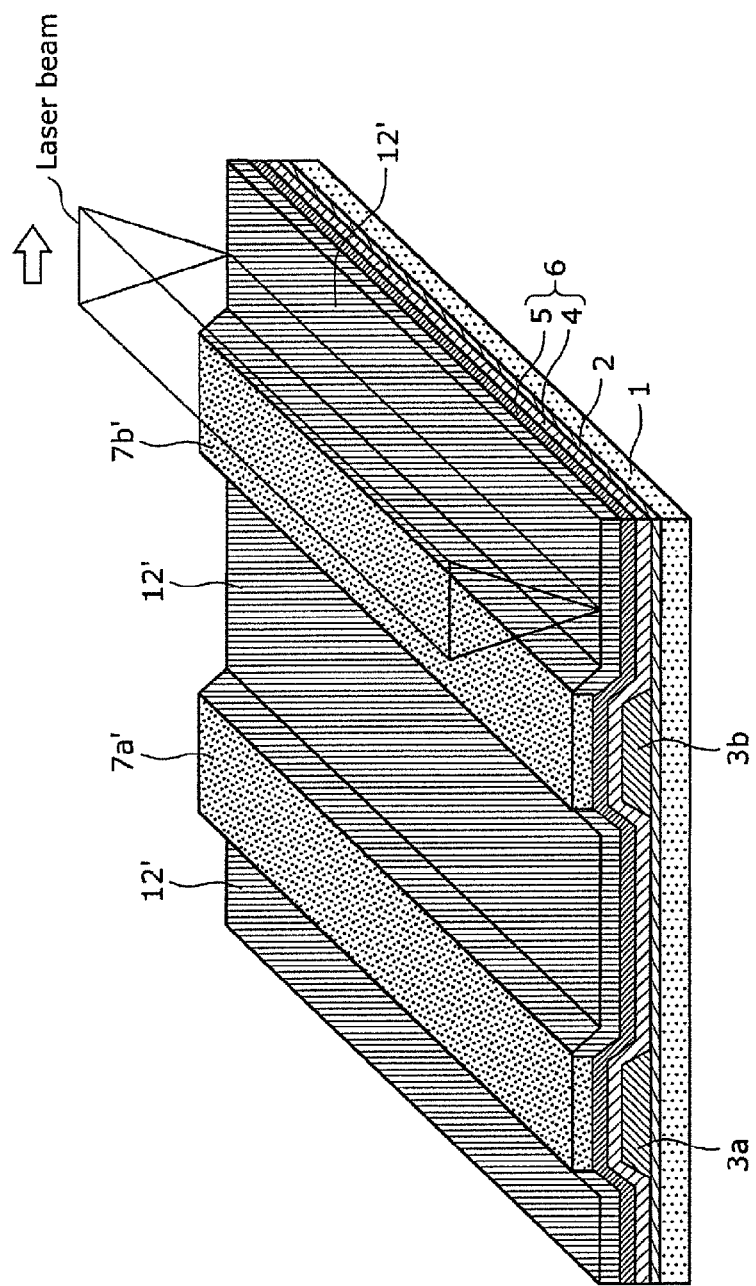
FIG. 3 schematically illustrates the laser annealing in FIG. 2F.

In the embodiment, the thickness of the gate insulating layer 6 formed in the third process and the thickness of the amorphous silicon layer 12 formed in the fourth process satisfy predetermined expressions (Expressions 1 to 5) to be described later. With this, to be described later, the absorptance of the laser beam by the amorphous silicon layer 12 in the regions above the gate electrodes 3a and 3b are greater than the absorptance of the laser beam by the amorphous silicon layer 12 in a region other than the regions above the gate electrodes 3a and 3b. Accordingly, in the regions above the gate electrodes 3a and 3b, the laser beam is absorbed in the amorphous silicon layer 12 and multi-reflected in the amorphous silicon layer 12. Accordingly, the amorphous silicon layer 12 in this region is crystallized by the heat of the laser beam. In contrast, in the region other than the regions above the gate electrodes 3a and 3b, the laser beam is not absorbed by the amorphous silicon layer 12 and transmitted through the amorphous silicon layer 12. Accordingly, the amorphous silicon layer 12 in this region is not crystallized. Accordingly, as illustrated in FIG. 3, in the regions above the gate electrodes 3a and 3b, crystalline silicon layer regions 7a' and 7b' made of polysilicon are formed. In the region other than the regions above the gate electrodes 3a and 3b, the amorphous silicon layer region 12' made of amorphous silicon is formed.

Here, the predetermined expressions (Expression 1 to Expression 5) that should be satisfied by the thickness of the gate insulating layer 6 and the thickness of the amorphous silicon layer 12 shall be described. Variables X and Y for representing the predetermined expressions are defined as follows. First, X represents a value obtained by dividing the optical thickness of the amorphous silicon layer 12 by the wavelength of the laser beam. The optical thickness of the amorphous silicon layer 12 is obtained by multiplying the thickness of the amorphous silicon layer 12 formed in the fourth process and the refractive index of the amorphous silicon layer 12. Next, the optical thickness of the silicon nitride film 4 obtained by multiplying the thickness of the silicon nitride film 4 and the refractive index of the silicon nitride film 4, and the optical thickness of the silicon oxide film 5 obtained by multiplying the thickness of the silicon oxide film 5 and the refractive index of the silicon oxide film 5 are added. Y is a value obtaining by dividing, by the wavelength of the laser beam, the value obtained by the addition.

Using X and Y defined as described above, the ranges suitable for the thicknesses of the gate insulating layer 6 and the amorphous silicon layer 12 are determined. More specifically, the thickness of the gate insulating layer 6 and the thickness of the amorphous silicon layer 12 are determined to satisfy X and Y in a range defined by the following Expressions 1 to 5.

$$Y \geq -4400X^6 + 12600X^5 - 14900X^4 + 9320X^3 - 3250X^2 + 594X - 43.7 \quad \text{(Expression 1)}$$

$$Y \leq 0.69 \quad \text{(Expression 2)}$$

$$Y \geq 0.33 \quad \text{(Expression 3)}$$

$$X \leq 0.85 \quad \text{(Expression 4)}$$

$$Y \leq -119000X^6 + 529000X^5 - 980000X^4 + 965000X^3 - 533000X^2 + 157000X - 19100 \quad \text{(Expression 5)}$$

Figure 4:
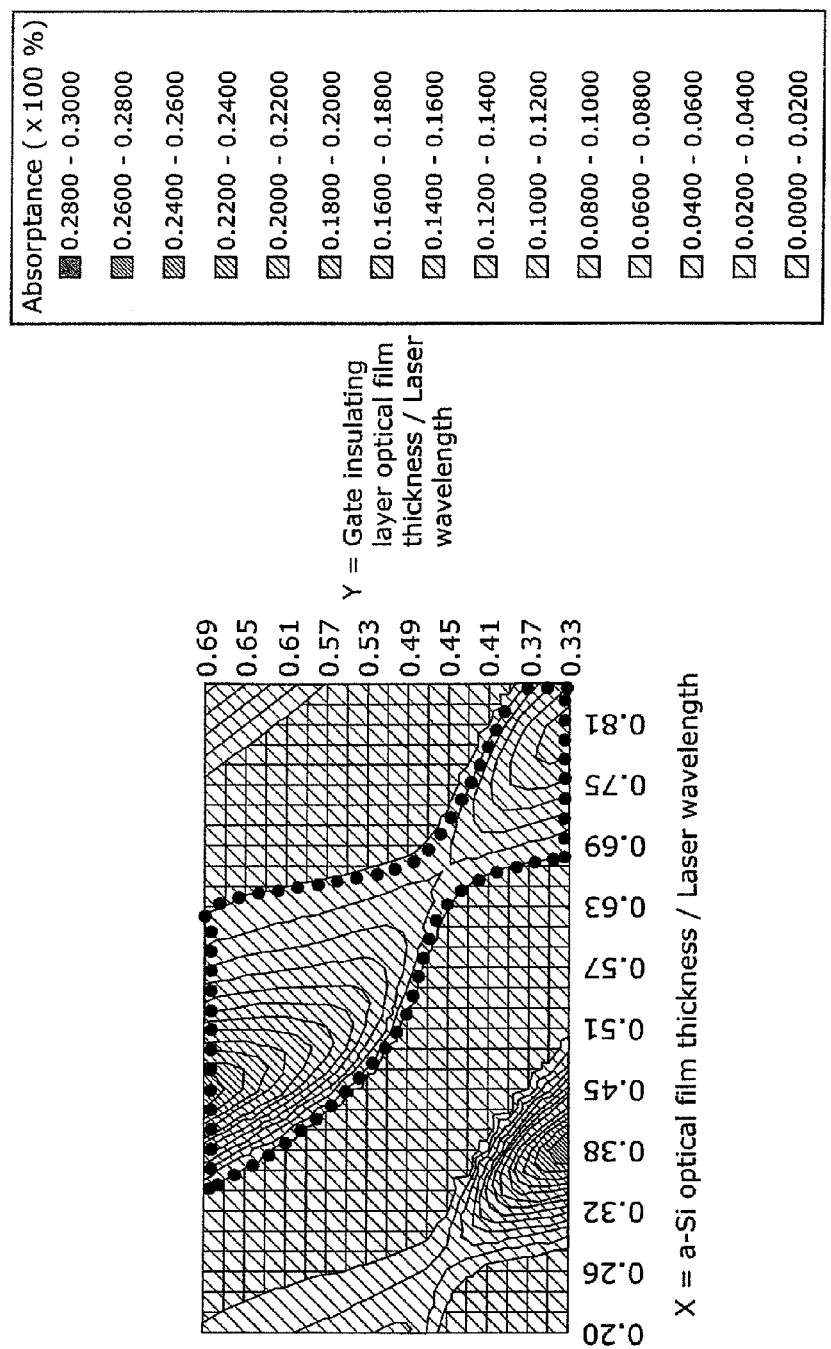
FIG. 4 is a diagram for describing that there are suitable ranges for the thickness of the gate insulating layer formed in the third process and the amorphous silicon layer formed in the fourth process when forming the crystalline silicon layer region by the laser annealing.

FIG. 4 is a diagram for describing that there are suitable ranges for the thicknesses of the gate insulating layer 6 and the amorphous silicon layer 12 when forming the crystalline silicon layer regions 7a' and 7b' by the laser annealing. In FIG. 4, the horizontal axis represents X described above, and the vertical axis represents Y described above. FIG. 4 shows a distribution of the difference of the absorptance of the amorphous silicon layer 12 for the laser beam with respect to X and Y described above (more specifically, a difference between the absorptance of the amorphous silicon layer 12 in the regions above the gate electrodes 3a and 3b for the laser beam and the absorptance of the amorphous silicon layer 12 in the region other than the regions above the gate electrodes 3a and 3b for the laser beam).

The region surrounded by the broken line in FIG. 4 is a region in which the difference in the absorptance for the laser beam is greater than 0 (more specifically, the absorptance of the amorphous silicon layer 12 in the regions above the gate electrodes 3a and 3b for the laser beam is greater than the absorptance of the amorphous silicon layer 12 in the region other than the regions above the gate electrodes 3a and 3b for the laser beam). The expressions 1 to 5 are expressions representing X and Y within the region. Accordingly, by determining the thickness of the gate insulating layer 6 and the thickness of the amorphous silicon layer 12 so as to satisfy X and Y in the range defined by Expressions 1 to 5, the absorptance of the laser beam by the amorphous silicon layer 12 in the regions above the gate electrodes 3a and 3b is greater than the absorptance of the amorphous silicon layer 12 in the region other than the regions above the gate electrodes 3a and 3b for the laser beam. With this, when irradiating the amorphous silicon layer 12 with the laser beam in the fifth process, the crystalline silicon layer regions 7a' and 7b' are formed in the regions above the gate electrodes 3a and 3b, and the amorphous silicon layer region 12' is formed in the region other than the regions above the gate electrodes 3a and 3b.

Figure 5A:
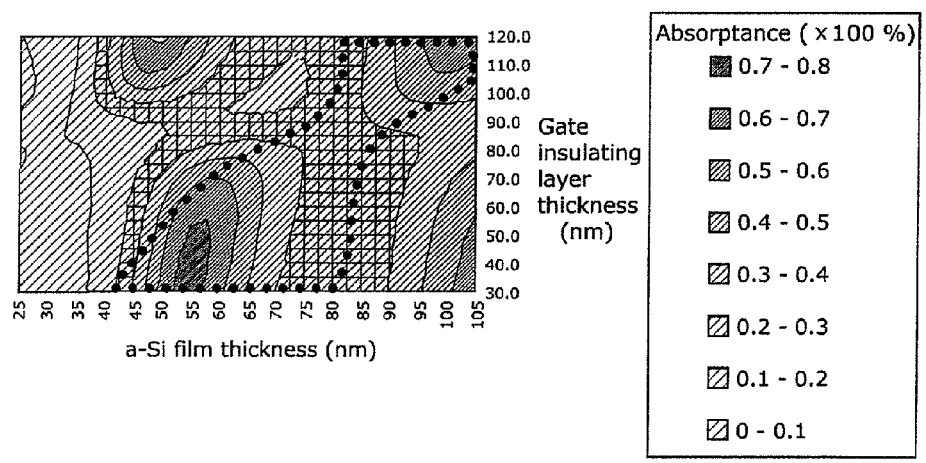
FIG. 5A is a distribution chart indicating absorptance of the amorphous silicon layer formed in the fourth process in a region above the gate electrode for the laser beam.
Figure 5B:
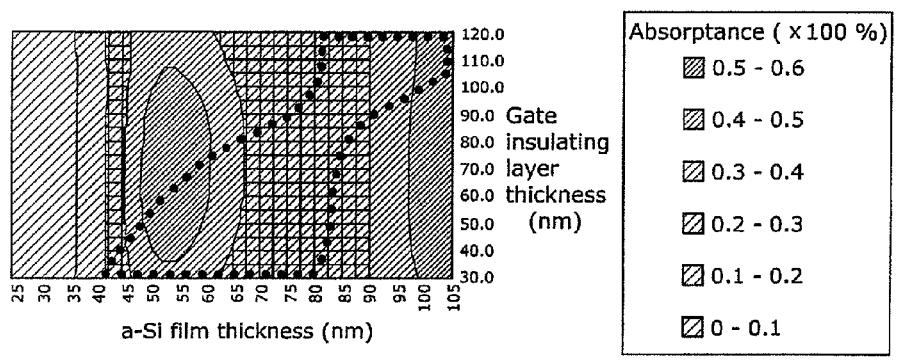
FIG. 5B is a distribution chart indicating absorptance of the amorphous silicon layer formed in the fourth process in a region other than the region above the gate electrode for the laser beam.
Figure 5C:
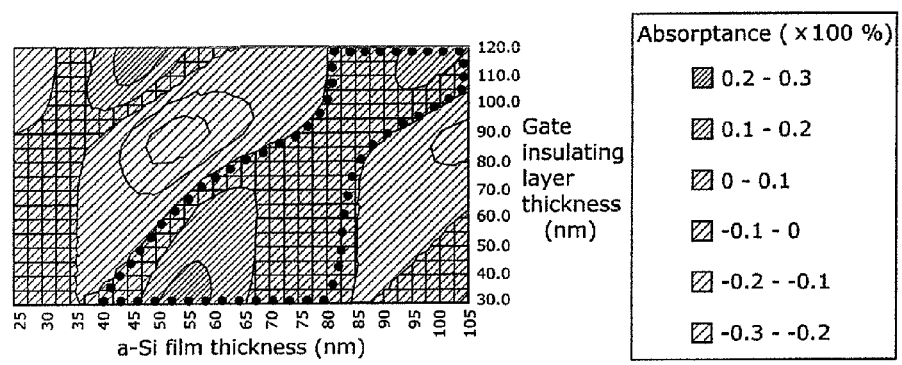
FIG. 5C is a distribution chart illustrating a difference between the absorptance of the amorphous silicon layer in the region above the gate electrode for the laser beam, and the absorptance of the amorphous silicon layer in the region other than the region above the gate electrode for the laser beam.

The distribution diagram in FIG. 4 may be obtained based on the distribution diagrams of FIGS. 5A to 5C. FIG. 5A is a distribution diagram illustrating the absorptance of the laser beam by the amorphous silicon layer 12 formed in the fourth process in the regions above the gate electrodes 3a and 3b. FIG. 5B is a distribution diagram illustrating the absorptance of the laser beam by the amorphous silicon layer 12 formed in the fourth process in the region other than the regions above the gate electrodes 3a and 3b. FIG. 5C is a distribution diagram illustrating the difference between the absorptance of the laser beam by the amorphous silicon layer 12 in the regions above the gate electrodes 3a and 3b and the absorptance of the laser beam by the amorphous silicon layer 12 in the region other than the regions above the gate electrodes 3a and 3b. In FIGS. 5A to 5C, the horizontal axis represents the actual value of the thickness of the amorphous silicon layer 12 formed in the fourth process, and the vertical axis represents the actual value of the thickness of the gate insulating layer 6 formed in the third process.

FIGS. 5A and 5B indicate distributions of the absorptance of the laser beam by the amorphous silicon layer 12 with respect to the thickness of the gate insulating layer 6 and the thickness of the amorphous silicon layer 12. FIG. 5C indicates distribution of the difference in the absorptance of the laser beam by the amorphous silicon layer 12 with respect to the thickness of the gate insulating layer 6 and the thickness of the amorphous silicon layer 12 (more specifically, the difference between the absorptance of the laser beam by the amorphous silicon layer 12 in the regions above the gate electrodes 3a and 3b and the absorptance of the laser beam by the amorphous silicon layer 12 in the region other than the regions above the gate electrodes 3a and 3b).

By comparing the absorptance for the laser beam illustrated in FIG. 5A and the absorptance for the laser beam illustrated in FIG. 5B, ranges of the thickness of the gate insulating layer 6 and the thickness of the amorphous silicon layer 12 in which the absorptance for the laser beam illustrated in FIG. 5A is greater than the absorptance for the laser beam illustrated in FIG. 5B is obtained. The ranges are the regions surrounded by the broken lines in FIGS. 5A to 5C. The regions correspond to the region surrounded by the broken line in FIG. 4. Note that, the distribution diagram in FIG. 4 is obtained by optically converting the thicknesses in the horizontal axis and the vertical axis in FIG. 5C.

Figure 6:
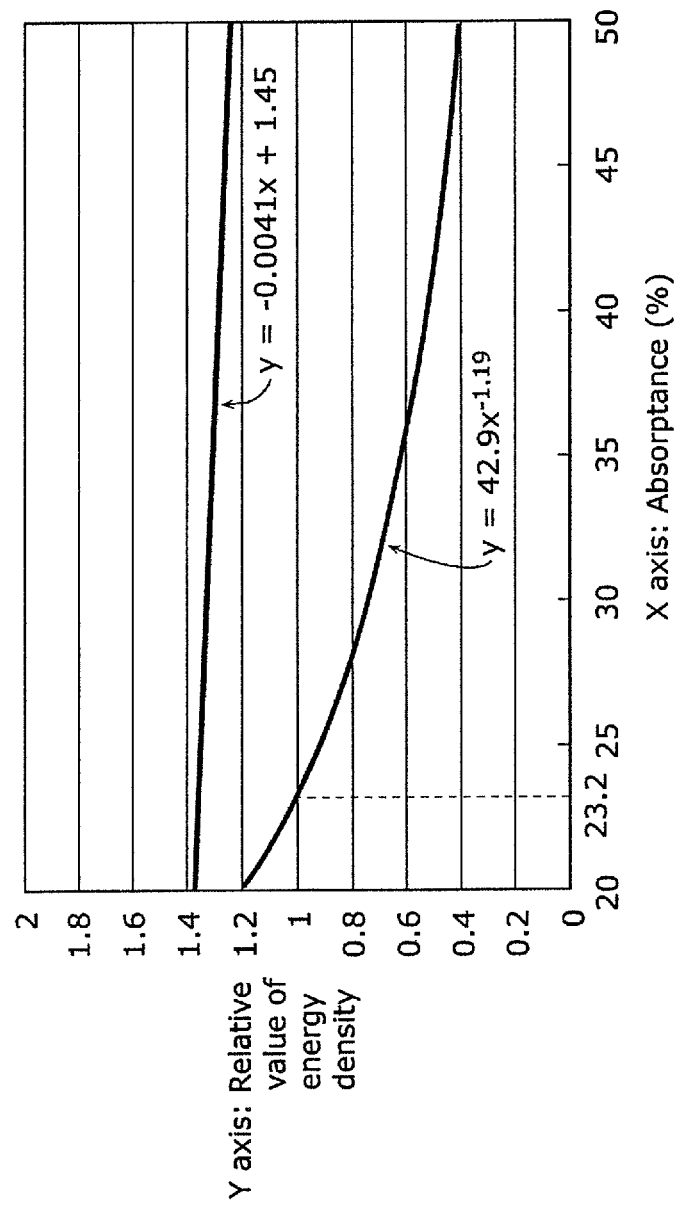
FIG. 6 is a diagram illustrating a relationship between the absorptance of the laser beam by the amorphous silicon layer formed in the fourth process and a relative value of the energy density of the laser beam.

Note that, in order to stably form the amorphous silicon layer regions 7a' and 7b' in the fifth process, it is preferable that the energy density of the laser beam satisfies the predetermined expressions (Expressions 6 to 8). FIG. 6 is a chart illustrating a relationship between the absorptance of the amorphous silicon layer 12 formed in the fourth process for the laser beam and the relative value of the energy density of the laser beam. In FIG. 6, the horizontal axis (X axis) represents the absorptance (%) of the laser beam by the amorphous silicon layer 12 formed in the fourth process. The vertical axis (Y axis) represents the relative value with respect to the energy density of the laser beam, which is defined as 1, necessary for crystallizing the amorphous silicon layer 12 so as to form the crystalline silicon layer regions 7a' and 7b when the absorptance of the amorphous silicon layer 12 formed in the fourth process for the laser beam is 23.2(%). Here, the absorptance of the amorphous silicon layer 12 for the laser beam and the energy density of the laser beam are preferably satisfy x and y in the range defined by the following expressions 6, 7, and 8.

$$20 \leq x \leq 50 \quad \text{(Expression 6)}$$

$$y \geq 42.9x^{-1.19} \quad \text{(Expression 7)}$$

$$y \leq -0.0041x + 1.45 \quad \text{(Expression 8)}$$

In FIG. 6, the graph above represents Expression 8, and the graph below represents Expression 7. The absorptance of the laser beam by the amorphous silicon layer 12 and the energy density of the laser beam is determined to satisfy x and y belonging to the range defined by Expressions 6, 7, and 8 described above allows forming the crystalline silicon layer regions 7a' and 7b' stably. Note that, when the value of y is smaller than the range defined by Expression 7, the energy density of the laser beam is too low to crystallize the amorphous silicon layer 12. When the value of y is greater than the range defined by Expression 8, the energy density of the laser beam is too high, and there is a possibility that the amorphous silicon layer 12 is damaged by the laser beam.

Figure 2G:
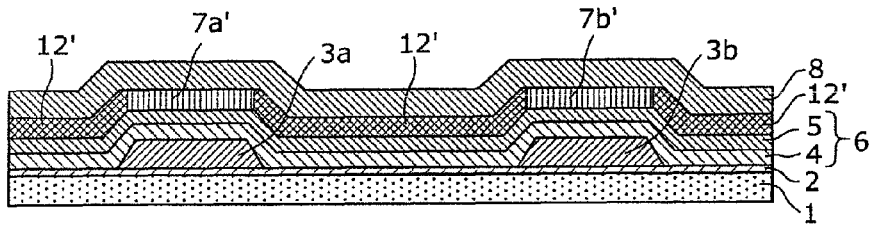
FIG. 2G is a cross-sectional view for describing the thin-film transistor array manufacturing method according to the embodiment of the present disclosure.
Figure 2H:
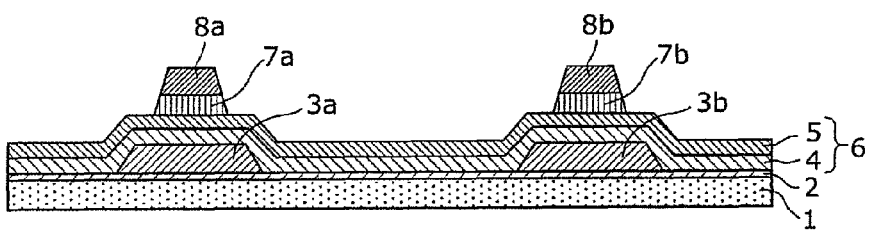
FIG. 2H is a cross-sectional view for describing the thin-film transistor array manufacturing method according to the embodiment of the present disclosure.

After the fifth process, the second amorphous silicon layer 8 is formed on the gate insulating layer 6 as illustrated in FIG. 2G by the plasma CVD. After that, as illustrated in FIG. 2H, the crystalline silicon layer regions 7a' and 7b' and the amorphous silicon layer region 12' are patterned, and the regions in the crystalline silicon layer regions 7a' and 7b' and the amorphous silicon layer region 12' are removed by etching. With this, in the thin-film transistor elements 100a and 100b, channel layers in which the crystalline silicon layers 7a and 7b and the amorphous silicon layers 8a and 8b are stacked are formed.

Figure 2I:
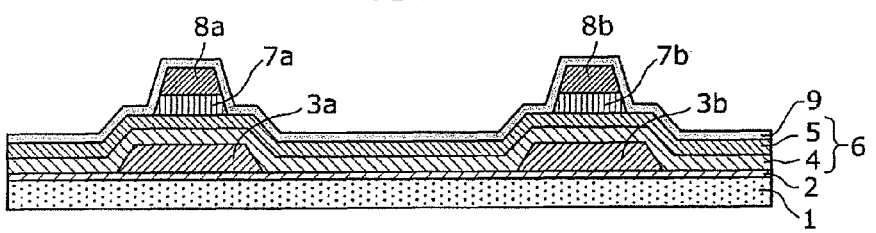
FIG. 2I is a cross-sectional view for describing the thin-film transistor array manufacturing method according to the embodiment of the present disclosure.

After that, as illustrated in FIG. 2I, the contact layer 9 is formed so as to cover the gate insulating layer 6 and the side surfaces of the crystalline silicon layers 7a and 7b and the amorphous silicon layers 8a and 8b. In this process, for example, the contact layer 9 made of amorphous silicon doped with an impurity of pentavalent element such as phosphorous (P) is formed by the plasma CVD.

Figure 2J:
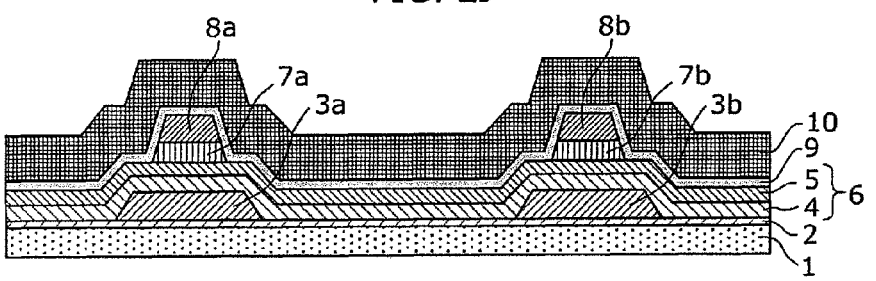
FIG. 2J is a cross-sectional view for describing the thin-film transistor array manufacturing method according to the embodiment of the present disclosure.
Figure 2K:
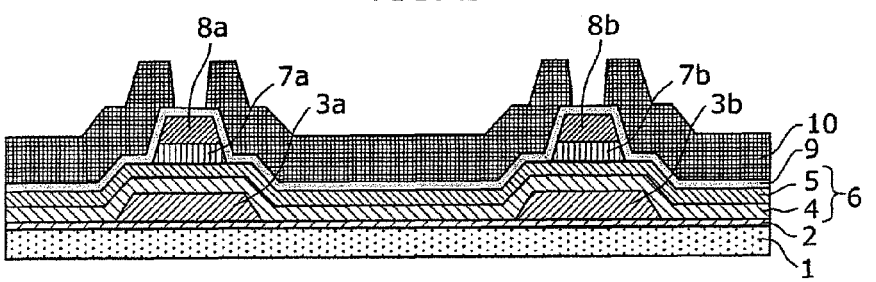
FIG. 2K is a cross-sectional view for describing the thin-film transistor array manufacturing method according to the embodiment of the present disclosure.
Figure 2L:
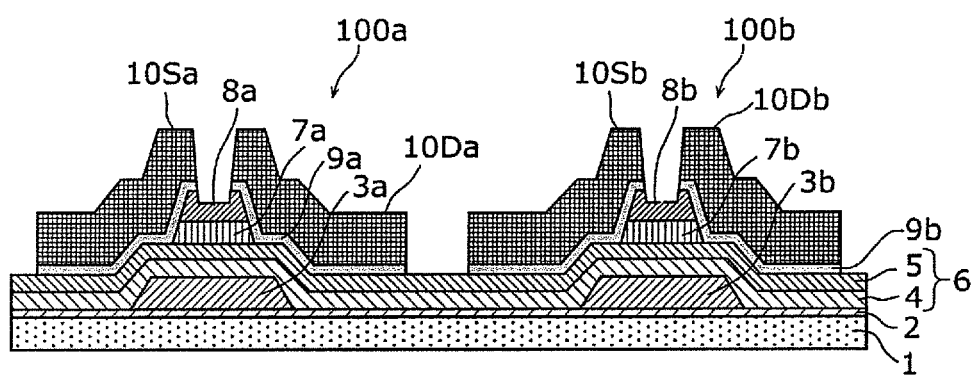
FIG. 2L is a cross-sectional view for describing the thin-film transistor array manufacturing method according to the embodiment of the present disclosure.

Subsequently, the source electrodes 10Sa, 10Sb and the drain electrodes 10Da and 10Db are patterned on the contact layer 9 (sixth process). In this sixth process, first, as illustrated in FIG. 2J, the source/drain metal film 10 made of the material for the source electrodes 10Sa and 10Sb and the drain electrodes 10Da and 10Db are formed by sputtering, for example. Subsequently, in order to form the source electrodes 10Sa and 10Sb and the drain electrodes 10Da and 10Db in the predetermined shape, a material for resist is applied on the source/drain metal film 10, and the material is exposed and developed so as to form a resist patterned into the predetermined shape. Next, using the resist as a mask, the source/drain metal film 10 is patterned by the wet etching. Subsequently, as illustrated in FIG. 2L, the source electrodes 10Sa and 10Sb and the drain electrodes 10Da and 10Db are formed. Here, the contact layer 9 functions as an etching stopper layer. Subsequently, the resist on the source electrodes 10Sa and 10Sb and the drain electrodes 10Da and 10Db is removed.

Subsequently, as illustrated in FIG. 2L, dry etching is performed using the source electrodes 10Sa and 10Sb and the drain electrodes 10Da and 10Db as the mask. With this, the contact layer 9 is patterned, and the source electrodes 10Sa and 10Sb and the drain electrodes 10Da and 10 Db are patterned into the form of islands. With this, the contact layers 9a and 9b, the source electrodes 10Sa and 10Sb and the drain electrodes 10Da and 10Db are formed in the form of islands. Note that, chlorine gas may be used as a condition for the dry etching.

The thin-film transistor array 200 according to the embodiment of the present disclosure is manufactured as described above.

Figure 7:
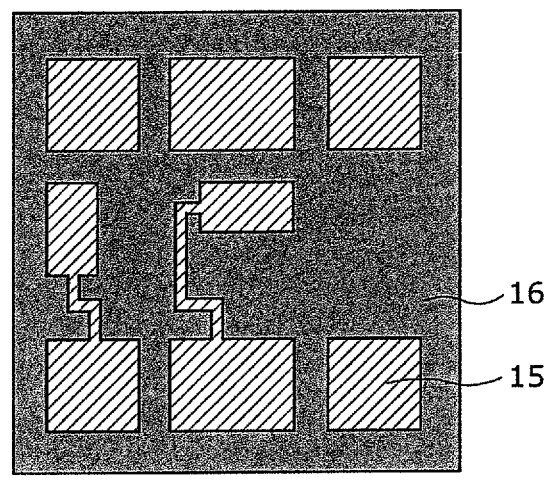
FIG. 7 is a plan view illustrating a state in which the amorphous silicon layer formed in the fourth process is irradiated with the laser beam.

Next, the operations and effects by the thin-film transistor array 200 according to the embodiment of the present disclosure shall be described. FIG. 7 is a plan view illustrating a state in which the amorphous silicon layer 12 formed in the fourth process is irradiated with the laser beam. The portions with oblique lines in FIG. 7 represent regions in which the crystalline silicon layer regions 7a' and 7b' are formed by crystallizing the amorphous silicon layer 12. In FIG. 7, the region 15 is a region above the gate electrodes 3a and 3b, and the region 16 is the region other than the region above the gate electrodes 3a and 3b. As illustrated in FIG. 7, in the fifth process, the crystalline silicon layer regions 7a' and 7b' are formed only in the region 15.

As described above, the amorphous silicon layer 12 is locally crystallized, and the heat by the laser beam is locally transmitted to the substrate 1 through the gate insulating layer 6. With this, it is possible to keep the thermal load on the substrate 1 small, suppressing occurrence of a crack or warpage in the substrate 1. Furthermore, it is possible to keep the stress generated at the time of crystallization of the amorphous silicon layer 12 small. This also suppresses the occurrence of the crack or warpage in the substrate 1.

Note that, as described above, the extinction coefficient of the gate insulating layer 6 with respect to the wavelength of the laser beam is set to be less than or equal to 0.01. Accordingly, the laser beam is barely absorbed by the gate insulating layer 6, and thus it is possible to suppress the heat by the laser beam generated in the gate insulating layer 6. With this, in the region other than the regions above the gate electrodes 3a and 3b, it is possible to effectively suppress the heat by the laser beam transmitted to the substrate 1.

Figure 8:
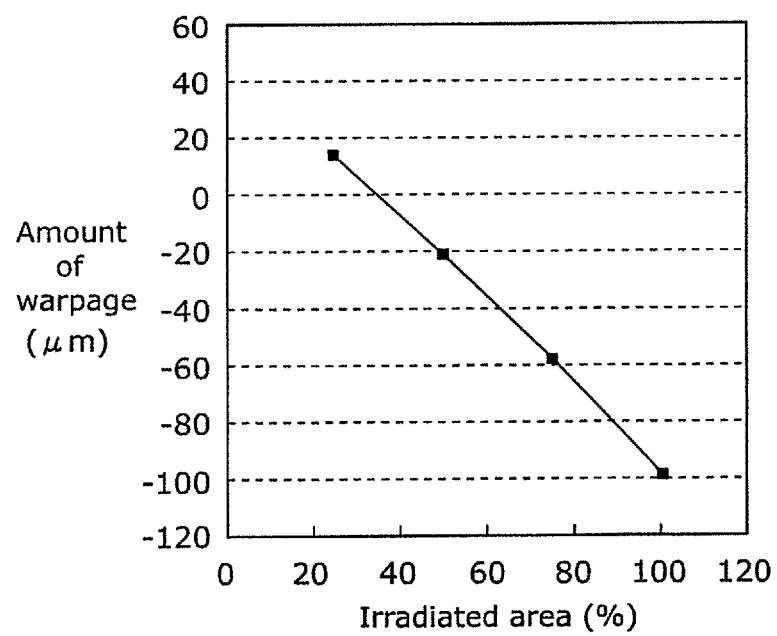
FIG. 8 is a chart illustrating a relationship between the area of the amorphous silicon layer irradiated with the laser beam and the amount of warpage in the substrate.

FIG. 8 is a chart illustrating the relationship between the irradiated area of the amorphous silicon layer 12 with the laser beam and the amount of warpage in the substrate 1. As illustrated in FIG. 8, as the area irradiated with the laser (more specifically, the area of the amorphous silicon layer 12 crystallized by the laser irradiation) increases, the amount of warpage in the substrate 1 increases. It is assumed that this is because the thermal load on the substrate 1 increases along with the increase in the area irradiated with the laser beam. With the conventional thin-film transistor array manufacturing method, the amorphous silicon layer 12 is entirely crystallized by the laser irradiation. Accordingly, approximately 100% of the area is irradiated with the laser beam, and the amount of warpage in the substrate 1 is approximately −100 μm. In the method of manufacturing the thin-film transistor array 200 according to the embodiment, only the amorphous silicon layer 12 in the regions above the gate electrodes 3a and 3b are crystallized. Accordingly, the area irradiated with the laser beam is approximately 17%, and the amount of warpage in the substrate 1 is approximately 20 μm, for example. As described above, with the method of manufacturing the thin-film transistor array 200 according to the embodiment, the amount of warpage in the substrate 1 is significantly reduced.

Figure 9:
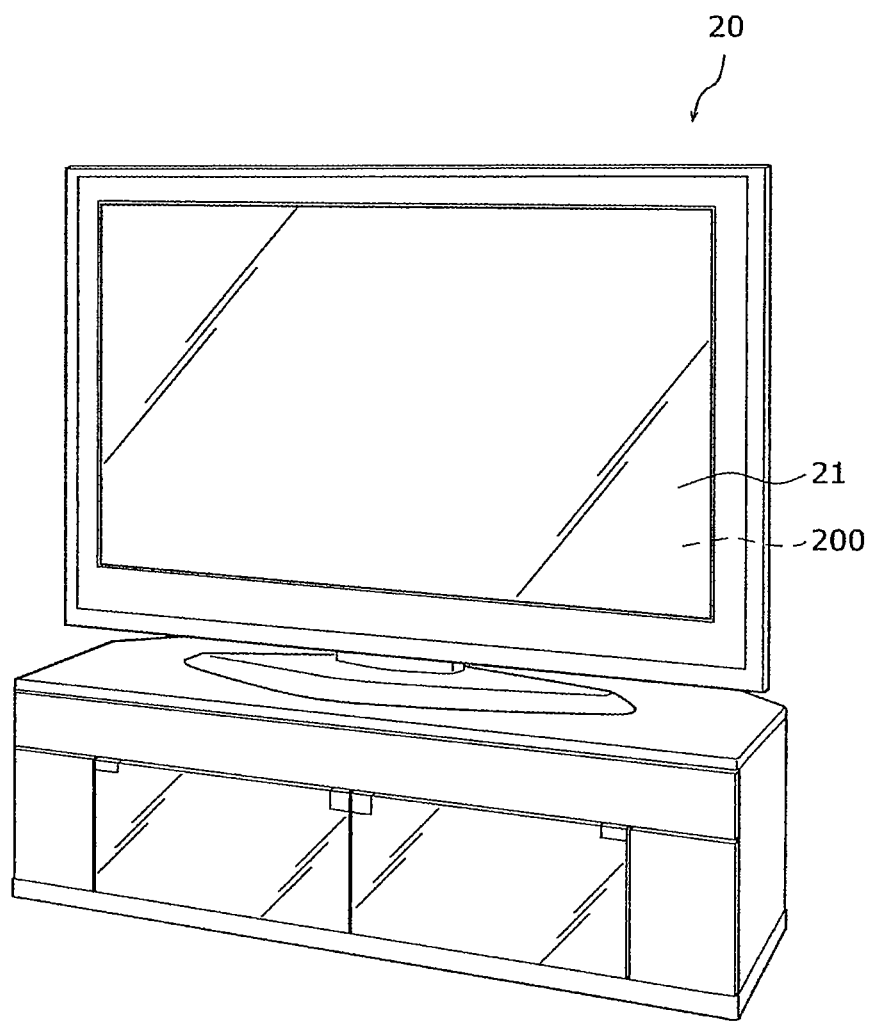
FIG. 9 illustrates a display device in which the thin-film transistor array according to the embodiment of the present disclosure is incorporated.
Figure 10:
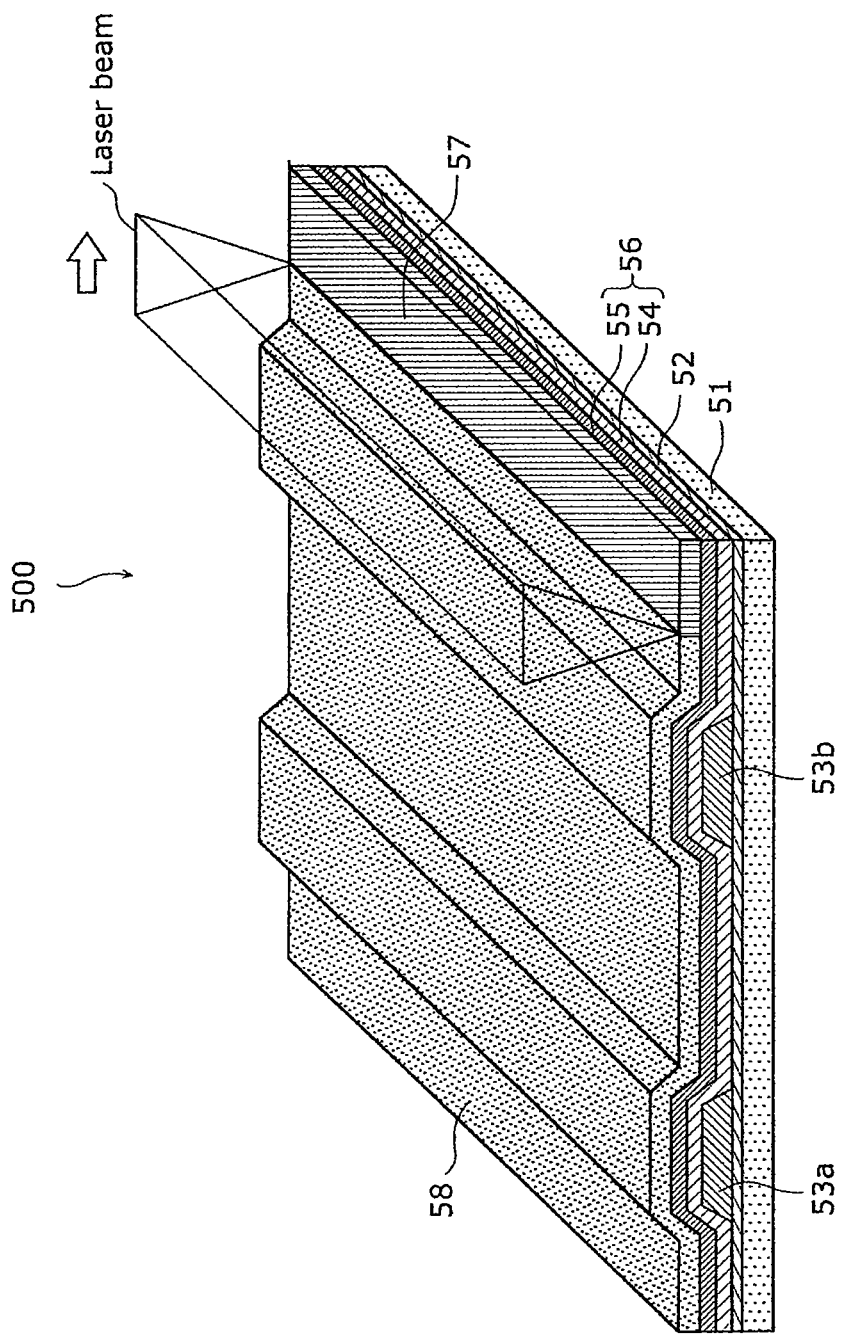
FIG. 10 is a perspective view schematically illustrating the laser annealing in a conventional thin-film transistor array manufacturing method.
Figure 11:
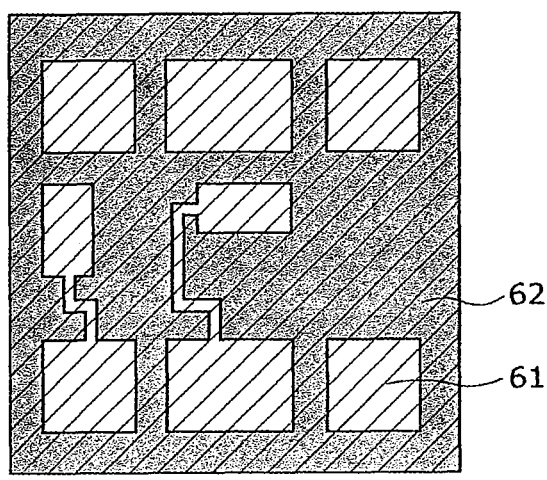
FIG. 11 is a plan view illustrating a state in which the amorphous silicon layer is irradiated with the laser beam in the conventional thin-film transistor array manufacturing method.

The thin-film transistor array 200 according to the embodiment can be incorporated in a display device 20 illustrated in FIG. 9, for example. The display device 20 illustrated in FIG. 9 includes a display panel 21 composed of a liquid crystal panel, an organic EL panel, or others. The display panel 21 is driven by the thin-film transistor array 200.

Although only some exemplary embodiment of the present disclosure has been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

In the embodiment, the amorphous silicon layer region 12' is made of amorphous silicon. However, the amorphous silicon layer region 12' may be made of microcrystalline silicon. Alternatively, the amorphous silicon layer region 12' may be made of a mixture of the microcrystalline silicon and amorphous silicon.

In the embodiment, the amorphous silicon layer 12 in the regions above the gate electrodes 3a and 3b are crystallized. However, for example, even if there is a region in which the amorphous silicon layer 12 is not crystallized in part of the regions above the gate electrodes 3a and 3b, it does not cause any problem in practical use.

Industrial Applicability

The thin-film transistor array according to the present disclosure may be widely used for display device for a television set, a personal computer, a mobile phone and others, and various electric appliances including the thin-film transistor array.

The invention claimed is:

1. A thin-film transistor array manufacturing method comprising:
   preparing a substrate;
   forming a plurality of gate electrodes above the substrate;
   forming a gate insulating layer above the gate electrodes;
   forming an amorphous silicon layer above the gate insulating layer;
   forming crystalline silicon layer regions by irradiating the amorphous silicon layer in regions above the gate electrodes with a laser beam while relatively moving, in a predetermined direction with respect to the substrate, a laser light source which emits the laser beam having a wavelength from 473 nm to 561 nm so as to crystallize the amorphous silicon layer in the regions above the gate electrodes; and
   forming source electrodes and drain electrodes above the crystalline silicon layer regions, wherein given that X represents a value obtained by dividing an optical film thickness of the amorphous silicon layer by a wavelength of the laser beam, the optical film thickness of the amorphous silicon layer being a value obtained by multiplying a thickness of the amorphous silicon layer formed in the forming the amorphous silicon layer and a refractive index of the amorphous silicon layer, and Y represents a value obtained by dividing an optical film thickness of the gate insulating layer by the wavelength of the laser beam, the optical film thickness of the gate insulating layer being a value obtained by multiplying a thickness of the gate insulating layer formed in the forming the gate insulating layer and a refractive index of the gate insulating layer, X and Y are values satisfying a range determined by Expressions 1 to 5, and given that x represents absorptance (%) of the laser beam by the amorphous silicon layer formed in the forming the amorphous silicon layer, and y represents a relative value with respect to an energy density of the laser beam, which is defined as 1, necessary for crystallizing the amorphous silicon layer so as to form the crystalline silicon layer regions when the absorptance, for the laser beam, of the amorphous silicon layer formed in the forming the amorphous silicon layer is 23.2(%), and x and y are value satisfying a range determined by Expressions 6, 7, and 8, $Y \geq -4400X^6 + 12600X^5 - 14900X^4 + 9320X^3 - 3250X^2 + 594X - 43.7$     Expression 1

$Y \leq 0.69$     Expression 2

$Y \geq 0.33$     Expression 3

$X \leq 0.85$     Expression 4

$Y \leq -119000X^6 + 529000X^5 - 980000X^4 + 965000X^3 - 533000X^2 + 157000x - 19100$     Expression 5

$20 \leq x \leq 50$     Expression 6

$y \geq 42.9x^{-1.19}$     Expression 7

$y \leq -0.0041x + 1.45$.     Expression 8

2. The thin-film transistor array manufacturing method according to claim 1,
wherein, in forming the crystalline silicon layer regions, an amorphous silicon layer region is formed in a region other than the regions above the gate electrodes, and
the amorphous silicon layer region includes microcrystalline silicon.

3. The thin-film transistor array manufacturing method according to claim 2, wherein the amorphous silicon layer region further includes amorphous silicon.

4. The thin-film transistor array manufacturing method according to claim 1,
wherein in forming the crystalline silicon layer regions, an amorphous silicon layer region is formed in a region other than the regions above the gate electrodes, and
the amorphous silicon layer region includes amorphous silicon.

5. The thin-film transistor array manufacturing method according to claim 1, wherein in forming the crystalline silicon layer regions, the laser light source emits the laser beam in a continuous wave mode or a quasi-continuous wave mode.

6. The thin-film transistor array manufacturing method according to claim 1, wherein an extinction coefficient of the gate insulating layer formed in the forming the gate insulating layer relative to the wavelength of the laser beam is less than or equal to 0.01.

7. The thin-film transistor array manufacturing method according to claim 1, wherein the gate insulating layer formed in the forming the gate insulating layer is a silicon oxide film.

8. The thin-film transistor array manufacturing method according to claim 1, wherein the gate insulating layer formed in the forming the gate insulating layer is a silicon nitride film.

9. A thin-film transistor array comprising:
a substrate:
a plurality of gate electrodes formed above the substrate;
a gate insulating layer formed above the gate electrodes;
a crystalline silicon layer formed above the gate insulating layer in regions corresponding to the gate electrodes; and
source electrodes and drain electrodes formed above the crystalline silicon layer in regions corresponding to the gate electrodes,
wherein, after forming an amorphous silicon layer on the gate insulating layer, the crystalline silicon layer is formed by irradiating the amorphous silicon layer in regions above the gate electrodes with a laser beam while relatively moving, in a predetermined direction with respect to the substrate, a laser light source which emits the laser beam having a wavelength from 473 nm to 561 nm so as to crystallize the amorphous silicon layer in the regions above the gate electrodes,
given that X represents a value obtained by dividing an optical film thickness of the amorphous silicon layer by a wavelength of the laser beam, the optical film thickness of the amorphous silicon layer being a value obtained by multiplying a thickness of the amorphous silicon layer formed in the forming the amorphous silicon layer and a refractive index of the amorphous silicon layer, and Y represents a value obtained by dividing an optical film thickness of the gate insulating layer by the wavelength of the laser beam, the optical film thickness of the gate insulating layer being a value obtained by multiplying a thickness of the gate insulating layer formed in the forming the gate insulating layer and a refractive index of the gate insulating layer, X and Y are values satisfying a range determined by Expressions 1 to 5, and given that x represents absorptance (%) of the laser beam by the amorphous silicon layer formed in the forming the amorphous silicon layer, and y represents a relative value with respect to an energy density of the laser beam, which is defined as 1, necessary for crystallizing the amorphous silicon layer so as to form the crystalline silicon layer when the absorptance, for the laser beam, of the amorphous silicon layer formed in the forming the amorphous silicon layer is 23.2 (%), and x and y are value satisfying a range determined by Expressions 6, 7, and 8, $Y \geq -4400X^6 + 12600X^5 - 14900X^4 + 9320X^3 - 3250X^2 + 594X - 43.7$     Expression 1

$Y \leq 0.69$     Expression 2

$Y \geq 0.33$     Expression 3

$X \leq 0.85$     Expression 4

$Y \leq -119000X^6 + 529000X^5 - 980000X^4 + 965000X^3 - 533000X^2 + 157000X - 19100$     Expression 5

$20 \leq x \leq 50$     Expression 6

$y \geq 42.9x^{-1.19}$     Expression 7

$y \leq -0.0041x + 1.45.$     Expression 8

10. A display device comprising:
a display panel; and
the thin-film transistor array according to claim 9,
wherein the thin-film transistor array drives the display panel.

\* \* \* \* \*